US009147473B2

(12) United States Patent
Kim et al.

(10) Patent No.: US 9,147,473 B2
(45) Date of Patent: Sep. 29, 2015

(54) APPARATUSES AND METHODS FOR DRIVING A VOLTAGE OF A WORDLINE OF A MEMORY

(71) Applicant: Micron Technology, Inc., Boise, ID (US)

(72) Inventors: Tae Kim, Boise, ID (US); Howard Kirsch, Eagle, ID (US); Charles Ingalls, Meridian, ID (US); K. Shawn Smith, Boise, ID (US); Jonathan Doebler, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 90 days.

(21) Appl. No.: 13/957,273

(22) Filed: Aug. 1, 2013

(65) Prior Publication Data
US 2015/0036442 A1 Feb. 5, 2015

(51) Int. Cl.
G11C 16/08 (2006.01)
G11C 8/08 (2006.01)
G11C 11/408 (2006.01)
G11C 11/418 (2006.01)
G11C 7/18 (2006.01)
G11C 11/4097 (2006.01)

(52) U.S. Cl.
CPC .............. G11C 16/08 (2013.01); G11C 8/08 (2013.01); G11C 11/4085 (2013.01); G11C 11/418 (2013.01); G11C 7/18 (2013.01); G11C 11/4097 (2013.01)

(58) Field of Classification Search
CPC ...... G11C 8/08; G11C 16/08; G11C 13/0026; G11C 13/0028; G11C 2213/71
USPC ............................ 365/189.11, 185.13, 185.23
See application file for complete search history.

(56) References Cited

U.S. PATENT DOCUMENTS

| 5,604,697 | A |  | 2/1997 | Takahashi et al. |
| 5,768,174 | A |  | 6/1998 | Seo et al. |
| 5,867,445 | A |  | 2/1999 | Kirsch et al. |
| 6,011,746 | A |  | 1/2000 | Oh |
| 6,025,751 | A |  | 2/2000 | Chiang et al. |
| 6,046,956 | A |  | 4/2000 | Yabe |
| 6,055,203 | A |  | 4/2000 | Agarwal et al. |
| 6,160,730 | A | * | 12/2000 | Tooher ............................ 365/63 |
| 6,160,753 | A |  | 12/2000 | Shibayama |
| 6,320,783 | B1 |  | 11/2001 | Kang et al. |
| 6,466,478 | B1 | * | 10/2002 | Park ........................ 365/185.11 |
| 7,002,825 | B2 |  | 2/2006 | Scheuerlein |
| 7,215,592 | B2 |  | 5/2007 | Cho et al. |
| 7,447,104 | B2 |  | 11/2008 | Leung |
| 7,474,556 | B2 |  | 1/2009 | Choi et al. |
| 7,633,788 | B2 |  | 12/2009 | Choi et al. |
| 2007/0165479 | A1 |  | 7/2007 | Rehm |

(Continued)

*Primary Examiner* — Richard Elms
*Assistant Examiner* — Ajay Ojha
(74) *Attorney, Agent, or Firm* — Dorsey & Whitney LLP

(57) ABSTRACT

Apparatuses, global and local wordline drivers, and methods for driving a wordline voltage in a memory is described. An example apparatus includes a memory array including a plurality of sub-arrays. The plurality of sub arrays are coupled to a wordline. The memory array further including a plurality of local wordline drivers coupled between a global wordline and the wordline. The plurality of local wordline drivers are configured to selectively couple the wordline to the global wordline during a memory access operation. The example apparatus further includes a global wordline driver configured to selectively couple the wordline to the global wordline during the memory access operation.

20 Claims, 6 Drawing Sheets

(56) References Cited

U.S. PATENT DOCUMENTS

| | | |
|---|---|---|
| 2007/0278554 A1 | 12/2007 | Song et al. |
| 2008/0002497 A1* | 1/2008 | Barth et al. .................. 365/205 |
| 2011/0317509 A1 | 12/2011 | Kim et al. |
| 2012/0063256 A1* | 3/2012 | Kim et al. ................ 365/230.06 |
| 2014/0226427 A1 | 8/2014 | Kim et al. |

* cited by examiner

APPARATUSES AND METHODS FOR DRIVING A VOLTAGE OF A WORDLINE OF A MEMORY

TECHNICAL FIELD

Embodiments of the invention relate generally to electronic memories, and more particularly, in one or more of the illustrated embodiments, to driving a voltage of a wordline of a memory.

DESCRIPTION OF RELATED ART

Advances in technology have resulted in high density memory architectures. Increasing density may be limited by reliability and device size requirements. In some designs, memory architectures are limited by driver sizes for driving wordline voltages during memory access operations. Some existing architectures use an n-channel pull-up transistor driver architecture, where a drain of an n-channel transistor is coupled to a voltage supply and the transistor is used to provide the voltage of the voltage supply to a wordline. The wordline drivers may be placed in gaps between each memory array. The voltage of the voltage supply may change based on whether the wordline is to be accessed. For example, the voltage of the voltage supply may be relatively low (e.g., −0.3 volts) for wordlines that are not accessed, while the voltage of the voltage supply may be relatively high (e.g., 3.2 volts) for wordlines that are to be accessed.

As known, relatively high voltage differentials between a gate and drain of an n-channel transistor may cause the transistor to degrade over time, which can result in reliability problems. A relatively high voltage differential condition may exist when the voltage differential between a gate and drain is equal or greater than, for example, 3.5 volts. However, an n-channel transistor of an n-channel pull-up transistor driver may be subject to such voltage conditions during normal operation, such as when accessing a wordline, as well as when not accessing a wordline. For example, due to the configuration of n-channel transistors, the n-channel pull-up transistor driver architecture requires a gate voltage to be greater than the voltage of the voltage supply by at least the threshold voltage of the n-channel transistor when accessing a wordline in order to overcome a voltage drop across the transistors and provide the full voltage of the voltage supply to the wordline. However, when the voltage at the drain of the n-channel transistor is relatively low (e.g., −0.3 volts) and the voltage at the gate is relatively high (e.g., 4.2 volts) for a wordline not being accessed, a relatively high voltage differential exists between the gate and the drain of the n-channel transistor. Another relatively high voltage differential condition that may exist is when the voltage at the drain is relatively high (e.g., 3.2 volts) and the voltage at the gate is relatively low (e.g., −0.3 volts) for a wordline not being accessed.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
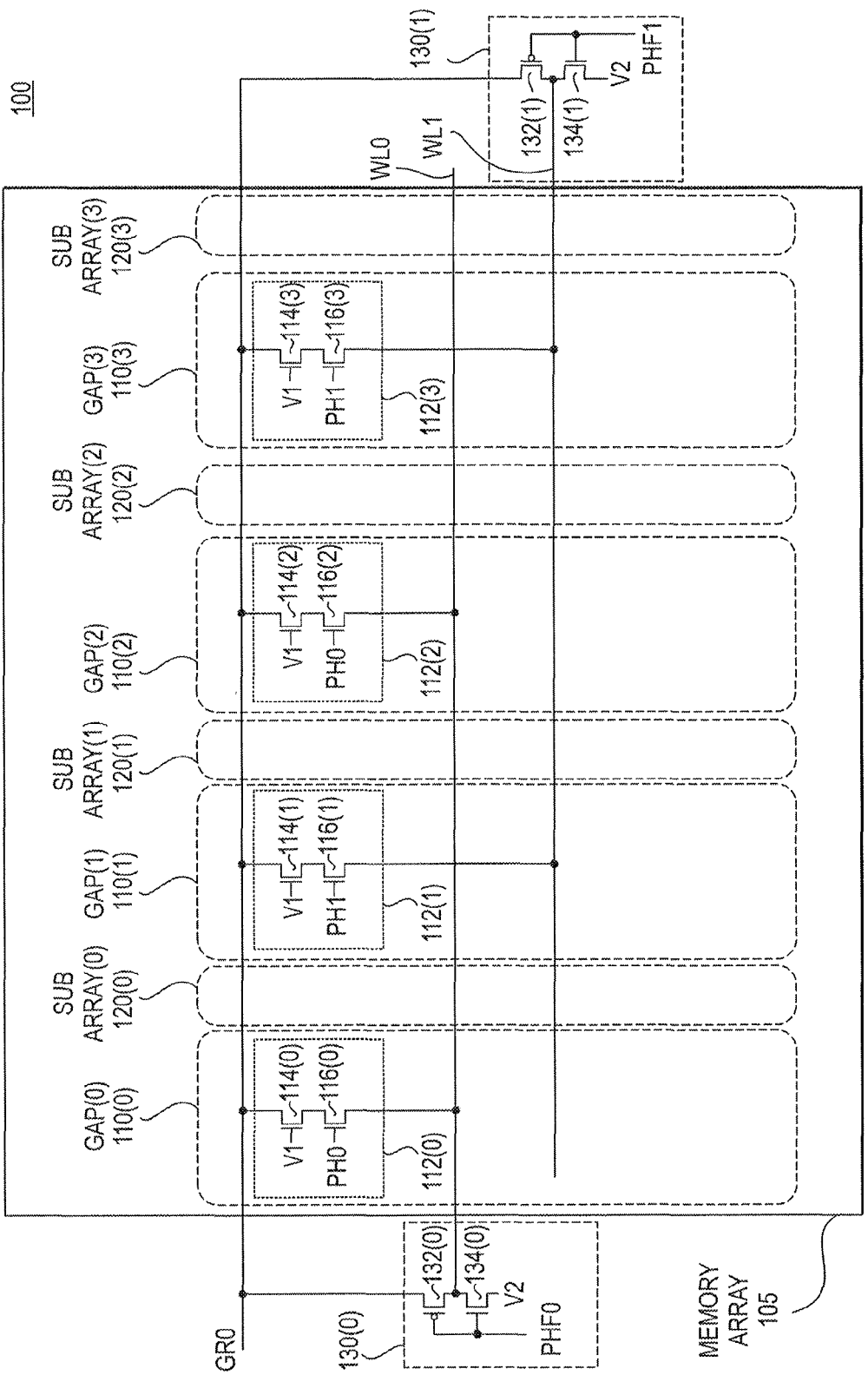
FIG. 1 is a block diagram of a particular illustrative embodiment of an apparatus including wordline drivers according to an embodiment of the disclosure.

Referring to FIG. 1, a particular illustrative embodiment of an apparatus including wordline drivers according to an embodiment of the invention is disclosed and generally designated 100. The apparatus 100 may be an integrated circuit, a memory device, a memory system, an electronic device or system, a smart phone, a tablet, a computer, a server, etc. The apparatus 100 may include a memory array 105 that includes sub-arrays 120(0-3) separated by gaps 110(0-3). Memory cells of the sub-arrays 120(0-3) may be coupled to respective wordlines WL0-1 to form a page of memory cells. The voltages of the wordlines WL0-1 may be driven by global wordline drivers 130(0-1) and by local wordline drivers 112(0-3). It will be appreciated that, while FIG. 1 depicts four sub-arrays, more or less than four sub-arrays may be included, and gaps between the sub-arrays may include a respective local wordline driver. Further, while FIG. 1 depicts two wordlines WL0-1 and two associated global wordline drivers 130(0-1), it will be appreciated that the apparatus 100 may include more than two wordlines, with each wordline having an associated global wordline driver.

The sub-arrays 120(0-3) may be non-volatile or volatile memory sub-arrays. As previously described, the memory cells of the sub-arrays 120(0-3) coupled to a common wordline WL0-1 may form a page of memory cells. In an embodiment, a page of memory cells may be contemporaneously accessed in a single memory access operation.

As previously described, the gap 110(0-3) may include respective local wordline drivers 112(0-3). Each of the local wordline drivers 112(0-3) may be coupled between a global wordline GR0 and a respective wordline WL0-1. For example, the local wordline drivers 112(0/2) may be coupled between the global wordline GR0 and the wordline WL0, and the local wordline drivers 112(1/3) may be coupled between the global wordline GR0 and the wordline WL1. The local wordline drivers 112(0-3) may be configured to selectively couple the global wordline GR0 to the respective wordline WL0-1 responsive to a respective control signal PH0-1. Each of the local wordline drivers 112(0-3) may include a respective first local wordline driver (LWD) transistor 114(0-3) coupled in series with a respective second LWD transistor 116(0-3). The gates of the first LWD transistor 114(0-3) may receive a first voltage V1, and responsive to the gate of the first LWD transistor 114(0-3) receiving the V1 voltage, the first LWD transistors 114(0-3) may be activated to couple the global wordline GR0 to the second LWD transistor 116(0-3). The gates of the second LWD transistor 116(0-3) may receive the respective PH0-1 signal. The second LWD transistor 116

(0-3) may selectively couple the global wordline GR0 to the respective wordline WL0-1 responsive to a value of the respective PH0-1 signal.

The global wordline drivers 130(0-1) may each be coupled between the global wordline GR0 and a second voltage V2. A node of the global wordline drivers 130(0-1) may be coupled to a respective wordline WL0-1. The global wordline driver 130(0-1) may be configured to selectively couple the global wordline GR0 to the respective wordline WL0-1. The global wordline driver 130(0-1) may each include a first global wordline driver (GWD) transistor 132(0-1) coupled in series with a second GWD transistor 134(0-1). A node between the first GWD transistor 132(0-1) and the second GWD transistor 134(0-1) may be coupled to a respective wordline WL0-1. The gates of the first GWD transistor 132(0-1) and the second GWD transistor 134(0-1) may each be coupled to a respective control signal PHF0-1. The global wordline driver 130(0-1) may couple the global wordline GR0 to the respective wordline WL0-1 responsive to the respective PHF0-1 signal having the V1 voltage. Further, the global wordline driver 130(0-1) may provide the V2 voltage to the respective wordline WL0-1 responsive to the respective PHF0-1 signal having the V2 voltage.

The V1 voltage may be a pumped voltage VCCP that is greater than a supply voltage VCC. In some embodiments, the VCCP voltage is 3.2 volts and the VCC voltage is 1.2 volts. The V2 voltage may be a pumped negative voltage VNWL less than a reference voltage, such as ground. In some embodiments, the VNWL voltage is −0.3 volts. The voltage of the global wordline GR0, and the voltages of the PH and PHF signals may be various voltages, which may be based at least in part on a memory operation and/or whether a wordline is to be accessed. For example, the voltage of the global wordline GR0 may be the VCCP voltage or the VNWL voltage, and the voltages of the PH and PHF signals may be the VCCP voltage or the VNWL voltage. The combination of the different voltages for GR0, PH, and PHF, as previously discussed, may be based at least in part on the memory operation and wordline access.

The first and second LWD transistors 114(0-3) and 116(0-3), and the second GWD transistors 134(0-3) are illustrated in FIG. 1 as n-channel transistors, and the first GWD transistors 132(0-3) are illustrated in FIG. 1 as p-channel transistors. The first and second LWD transistors 114(0-3) and 116(0-3) and the first and second GWD transistors 132(0-3) and 134(0-3) may be other types of circuits, however, and are not limited to the specific transistors illustrated in FIG. 1.

In operation, during a first portion of a memory access operation associated with a first page coupled to the wordline WL0, the PH0 signal may transition to the V1 voltage, and the PHF0 signal may transition to the V2 voltage. The V1 voltage may be equal to the VCCP voltage and the V2 voltage may be equal to the VNWL voltage. Also during the first portion of the memory access operation, the global wordline GR0 voltage may be equal to the V1 voltage. As explained above, the first LWD transistor 114(0-3) may couple the global wordline GR0 to the respective second LWD transistor 116(0-3). It will be appreciated that under the previously described voltage conditions, the voltage provided to the drain of the respective second LWD transistor 116(0-3) may be less than the V1 voltage of the global wordline GR0 by a threshold voltage of the first LWD transistor 114(0-3).

The PH0 signal having the V1 voltage may activate the second LWD transistors 116(0/2) to provide the voltage at the respective drains to the wordline WL0. Further, the PHF0 signal having the V2 voltage may activate the first GWD transistor 132(0) to couple the global wordline GR0 to the wordline WL0, and deactivate the second GWD transistor 134(0) to keep it from providing the V2 voltage to the wordline WL0. The wordline WL0 may be charged to the voltage of the global wordline GR0 (e.g., the V1 voltage) based on activation of the second LWD transistor 116(0) and activation of the first GWD transistor 132(0). In an embodiment, the wordline WL0 may be initially charged at a first rate based on the voltage provided by the second LWD transistors 116(0/2) and the global wordline driver 130(0), and may be charged at a second rate based on the voltage provided from the global wordline GR0 via the global wordline driver 130(0). The second rate may begin when the voltage of the wordline WL0 reaches the V1 voltage minus the threshold voltage of the first LWD transistors 114(0/2). Assisting charging the wordline WL0 via the local wordline drivers 112(0/2) to the V1 voltage minus the threshold voltage may decrease a time to charge the wordline WL0 to the V1 voltage as compared with charging the wordline using only the first GWD transistor 132(0).

Further, during a second portion of the memory access operation associated with the first page, the global wordline GR0 voltage may transition to the V2 voltage. Also during the second portion of the memory access operation, the PH0 signal may transition to the V2 voltage. The PH0 signal having the V2 voltage may deactivate the second LWD transistor 116(0) to decouple the wordline WL0 from the global wordline GR0. The voltage of the wordline WL0 may be discharged to the V2 voltage based on the voltage of the global wordline GR0 via the first GWD transistor 132(0). The PHF0 signal may transition to the V1 voltage, and the PHF0 signal having the V1 voltage may deactivate the first GWD transistor 132(0) to decouple the global wordline GR0 from the wordline WL0, and may activate the second GWD transistor 134(0) to provide the V2 voltage to the wordline WL0. The activated second GWD transistor 134(0) may hold the wordline WL0 at the V2 voltage.

It will be appreciated that a memory access operation associated with the wordline WL1 would operate similarly as the memory access operation associated with the wordline WL0, using the global wordline driver 130(1) and the local wordline drivers 112(1/3), rather than the global wordline driver 130(0) and the local wordline drivers 112(0/2), respectively. As previously discussed, in an embodiment, the V1 voltage may be 3.2 volts and the V2 voltage may be −0.3 volts. Using p-channel transistors in the global wordlines drivers 130(0-1) to drive the wordline voltage WL0-1 may limit the maximum voltage differential across the transistors of the local wordline drivers 112(0-3) to be a difference between V1 and V2. Thus, the degradation over time of the local wordline drivers 112(0-3) may be reduced, and reliability may be improved over architectures that require driving local wordline drivers that use pumped voltages greater than V1.

Figure 2:
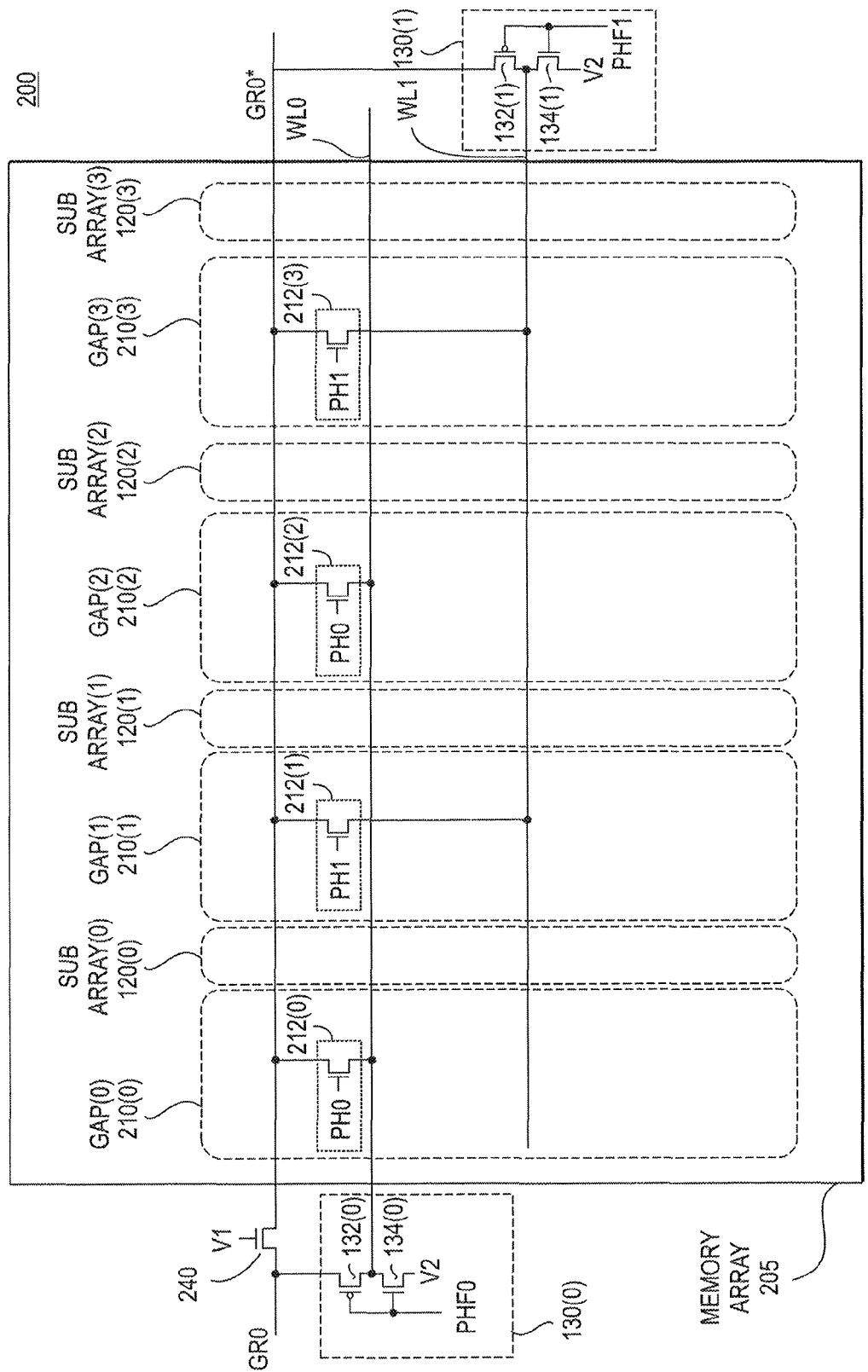
FIG. 2 is a block diagram of a particular illustrative embodiment of an apparatus including wordline drivers according to an embodiment of the disclosure.

Referring to FIG. 2, a particular illustrative embodiment of an apparatus including wordline drivers according to an embodiment of the invention is disclosed and generally designated 200. The apparatus 200 may include a memory array 205 that includes sub-arrays 120(0-3) separated by gaps 210(0-3). The apparatus 200 includes elements that have been previously described with respect to the apparatus 100 of FIG. 1. Those elements have been shown in FIG. 2 using the same reference numbers used in FIG. 1, and operation of the common elements is as previously described. Consequently, a detailed description of the operation of these elements will not be repeated in the interest of brevity.

The wordlines WL0-1 may be driven by global wordline driver 130(0-1) and by local wordline drivers 212(0-3). The global wordline GR0 may include a first portion identified by GR0 and a second portion identified by GR0*. The global wordline GR0 may be separated from the global wordline GR0* via a global wordline transistor 240. A gate of the global wordline transistor 240 may receive the V1 voltage, and when the global wordline GR0 is equal to the V1 voltage, a voltage provided to the global wordline GR0* may be the V1 voltage less a threshold voltage of the global wordline transistor 240.

The gaps 210(0-3) may include respective local wordline drivers 212(0-3) coupled between a global wordline GR0* and a respective wordline WL0-1. For example, the local wordline drivers 212(0/2) may each be coupled between the global wordline GR0 and the wordline WL0, and the local wordline drivers 212(1/3) may each be coupled between the global wordline GR0* and the wordline WL1. The gates of the local wordline drivers 212(0-3) may receive a respective control signal PH0-1. The local wordline drivers 212(0-3) may selectively couple the global wordline GR0 to the respective wordline WL0-1 responsive to a value of the respective PH0-1 signal.

In operation, during a first portion of a memory access operation associated with a first page coupled to the wordline WL0, the PH0 signal may be at the V1 voltage, and the PHF0 signal may be at the V2 voltage. The V1 voltage may be equal to the VCCP voltage and the V2 voltage may be equal to the VNWL voltage. Also during the first portion of the memory access operation, the global wordline GR0 voltage may be equal to the V1 voltage. As previously described, the global wordline transistor 240 may provide the V1 voltage less a threshold voltage of the global wordline transistor 240 to the global wordline GR0* for an n-channel global wordline transistor 240.

The PH0 signal having the V1 voltage may activate the local wordline drivers 212(0/2) to couple the global wordline GR0* to the wordline WL0. Further, the PHF0 signal having the V2 voltage may activate the first GWD transistor 132(0) to couple the global wordline GR0 to the wordline WL0 and deactivate the second GWD transistor 134(0) from providing the V2 voltage to the wordline WL0. The voltage of the wordline WL0 may be charged to the voltage of the global wordline GR0 based on activation of the local wordline drivers 212(0/2) and activation of the first GWD transistor 132(0). In an embodiment, the wordline WL0 may be initially charged at a first rate that is based on the voltage provided from the global wordline GR0* via the local wordline drivers 212(0/2) and from the global wordline GR0 via the first GWD transistor 132(0), and may be charged at a second rate based on the voltage provided from the global wordline GR0 via the first GWD transistor 132(0). The second rate may begin when the voltage of the wordline WL0 reaches the voltage of the global wordline GR0*. Charging the wordline WL0 at several points via the local wordline drivers 212(0/2) may decrease a time to charge the wordline WL0 to the V1 voltage provided by the global wordline GR0 as compared with charging the wordline using only the first GWD transistor 132(0).

Further, during a second portion of the memory access operation associated with the first page, the global wordline GR0 voltage may transition to the V2 voltage. Also during the second portion of the memory access operation, the PH0 signal may transition to the V2 voltage. The PH0 signal having the V2 voltage may deactivate the local wordline drivers 212(0/2) to decouple the global wordline GR0* from the wordline WL0. The voltage of the wordline WL0 may be discharged to the V2 voltage of the global wordline GR0 via the first GWD transistor 132(0). The PHF0 signal may transition to the V1 voltage, and the PHF0 signal having the V1 voltage may deactivate the first GWD transistor 132(0) to decouple the global wordline GR0 from the wordline WL0, and may activate the second GWD transistor 134(0) to provide the V2 voltage to the wordline WL0. The activated second GWD transistor 134(0) may hold the wordline WL0 at the V2 voltage.

It will be appreciated that a memory access operation associated with the wordline WL1 would operate similarly as the memory access operation associated with the wordline WL0, using the global wordline driver 130(1) and the local wordline driver 212(1/3), rather than the global wordline driver 130(0) and the local wordline drivers 212(0/2), respectively. In an embodiment, the V1 voltage may be 3.2 volts and the V2 voltage may be −0.3 volts. Using a p-channel transistor in the global wordlines drivers 130(0-1) to drive the wordline WL0-1 voltage may limit the maximum voltage differential across the transistors of the local wordline drivers 112(0-3) and across the global wordline transistor 240 to be a difference between V1 and V2. Thus, the degradation over time of the local wordline drivers 112(0-3) may be reduced, and reliability may be improved over architectures that require driving local wordline drivers using voltages greater than V1.

Figure 3:
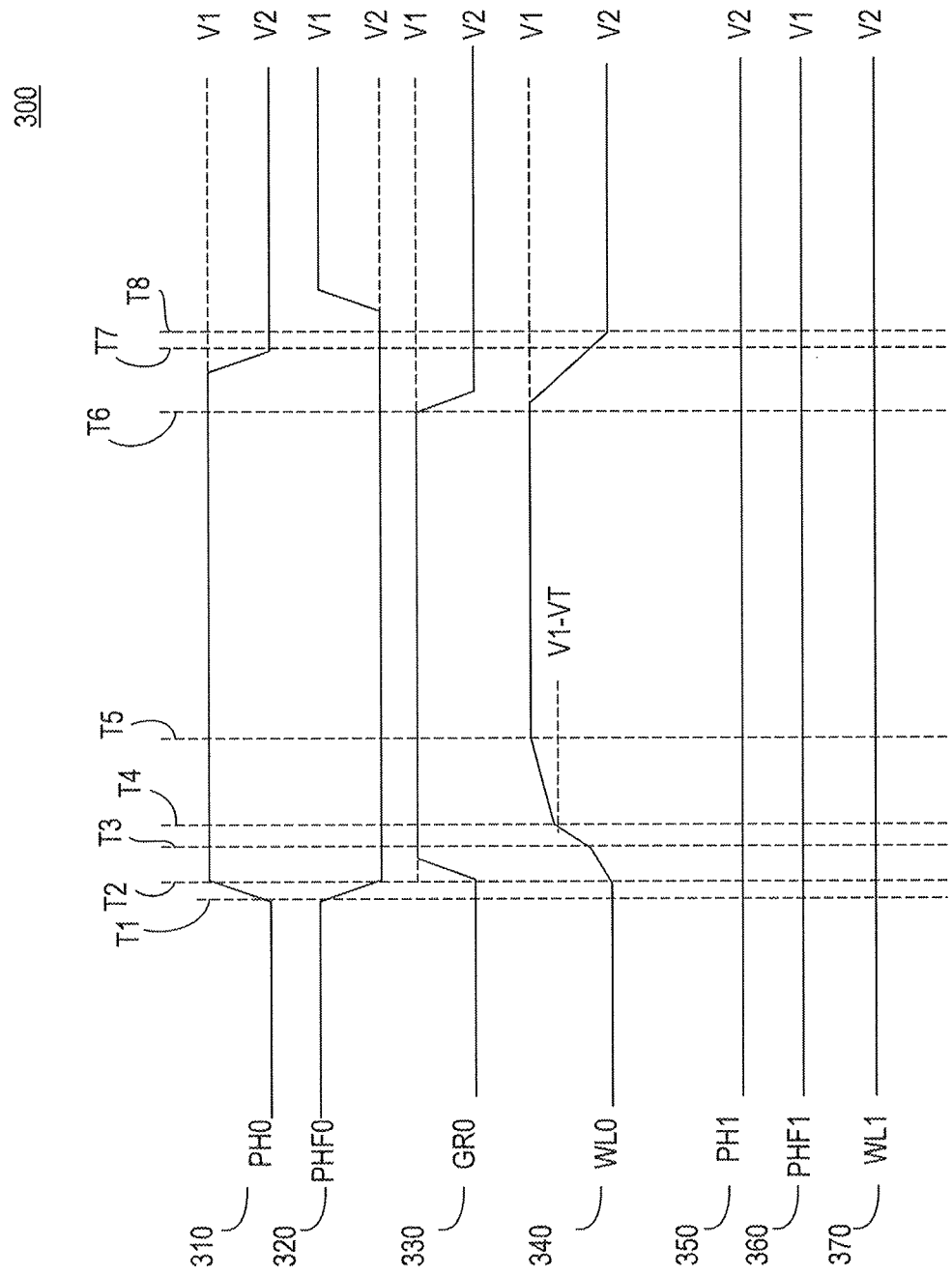
FIG. 3 is an exemplary timing diagram of driving a wordline voltage according to an embodiment of the disclosure.

Referring to FIG. 3, an exemplary timing diagram of driving a wordline voltage according to an embodiment of this disclosure is disclosed and generally designated 300. For example, the exemplary timing diagram 300 illustrates timing characteristics for various signals during operation of the apparatus 100 of FIG. 1 and/or the apparatus 200 of FIG. 2 according to an embodiment of the invention. The timing diagram 300 depicts exemplary timing associated with operation of global and local wordline drivers during a memory access operation associated with the wordline WL0. A PH0 signal 310, a PHF0 signal 320, a global wordline GR0 voltage 330, a wordline WL0 voltage 340, a PH1 signal 350, a PHF1 signal 360, and a wordline WL1 voltage 370 may correspond to the PH0 signal, the PHF0 signal, the PH1 signal, the PHF1 signal, the voltage of the global wordline GR0 voltage, the voltage of the wordline WL0, and the voltage of the wordline WL1, respectively, of FIGS. 1 and 2. Since this is an exemplary memory access operation associated with the wordline WL0, the voltages of the PH1 signal 350, PHF1 signal 360, and wordline WL1 voltage 370 remain unchanged.

Prior to time T1, the PH0 signal 310, and the global wordline GR0 voltage 330 may be set to the V2 voltage and the PHF0 signal 320 may be set to the V1 voltage. At time T1, a first portion of the memory access operation includes transitioning the PH0 signal 310 to the V1 voltage and the PHF0 signal 320 to the V2 voltage, which may activate the global and local wordline drivers, such as the global wordline driver 130(0) and local wordline drivers 112(0/2), respectively, of FIG. 1 and/or the global wordline driver 130(0) and the local wordline drivers 212(0/2) of FIG. 2. At time T2, the global wordline GR0 voltage 330 begins transitioning to the V1 voltage, and the wordline WL0 voltage 340 begins ramping from the V2 voltage at a first rate based on the change in the global wordline GR0 voltage 330 via the global and local wordline drivers.

At time T3, the wordline WL0 voltage 340 begins ramping at a second rate that is faster than the first rate as the local wordline drivers and the global wordline driver become fully activated to charge the wordline to the V1 voltage less a threshold voltage VT of the local wordline driver. At time T4, when the wordline WL0 voltage 340 has reached the V1 voltage less a threshold voltage VT of the local wordline driver, the global wordline driver continues to charge the wordline WL0 voltage 340 to the V1 voltage at a third rate that is slower than the first rate. At time T5, the wordline WL0 voltage 340 is fully charged to the V1 voltage.

At time T6, the second portion of the memory access operation includes the global wordline GR0 voltage 330 transitioning to the V2 voltage, which may cause the wordline WL0 voltage 340 to begin discharging toward the V2 voltage via the global and local wordline drivers. At time T7, the PH0 signal 310 may transition to the V2 voltage, which may deactivate the local wordline drivers. At time T8, the wordline WL0 voltage 340 has reached the V2 voltage. Between times T7 and T8, the wordline WL0 voltage 340 completely discharges to the V2 voltage. After time T8, the PHF0 signal 320 may transition to the V1 voltage to hold the wordline at the V2 voltage via the global wordline driver.

The exemplary timing diagram 300 is a non-limiting illustration to provide a sufficient understanding of embodiments of the disclosure. Those of ordinary skill in the art will appreciate that the relative timing of the signals of the exemplary timing diagram 400 may vary from system to system. For example, relative timing of transitions of the signals may vary. For example, the transition of the wordline WL0 voltage 340 may occur at different relative rates than depicted.

Figure 4:
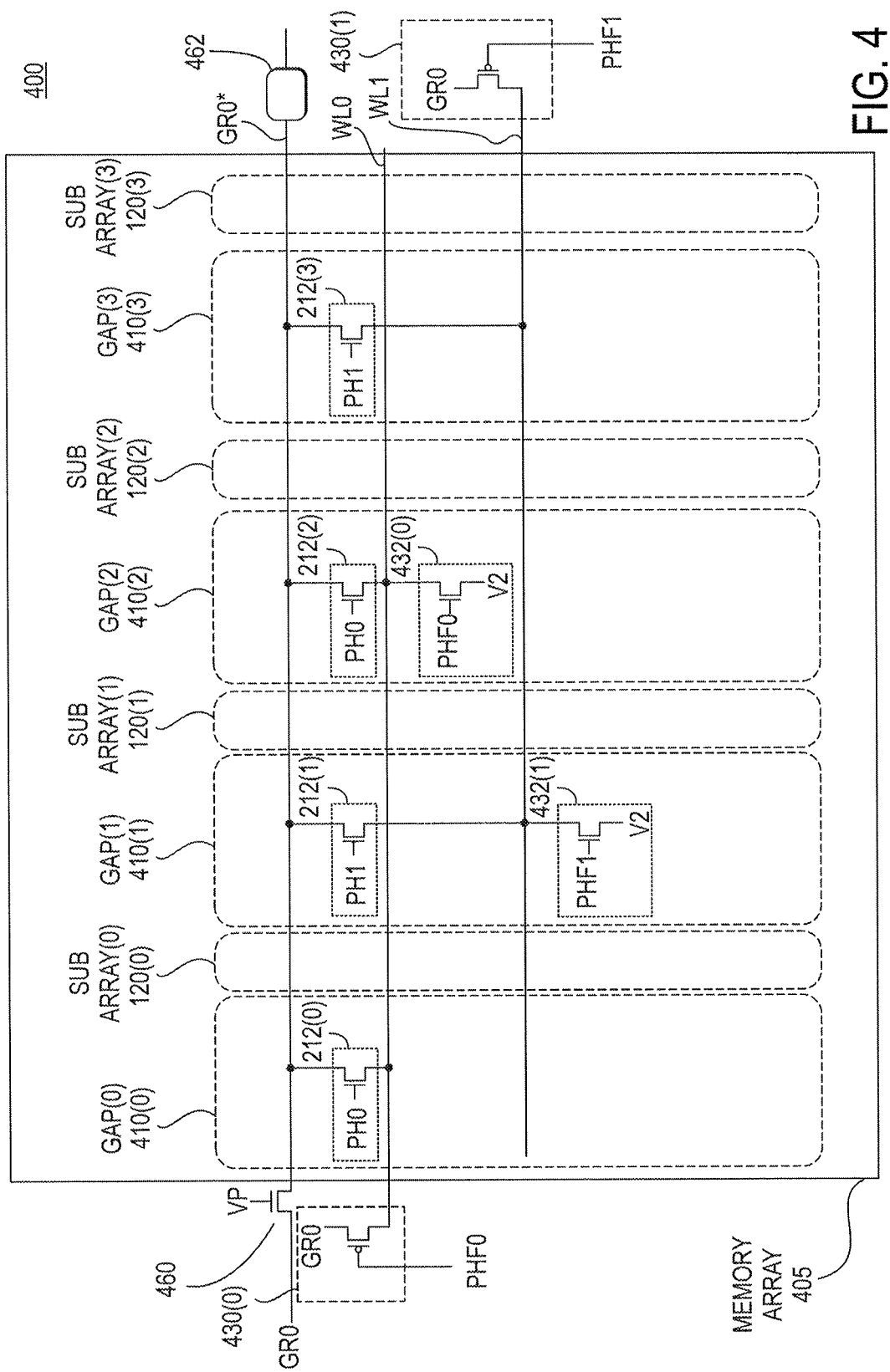
FIG. 4 is a block diagram of a particular illustrative embodiment of an apparatus including wordline drivers according to an embodiment of the disclosure.

Referring to FIG. 4, a particular illustrative embodiment of an apparatus including wordline drivers according to an embodiment of the invention is disclosed and generally designated 400. The apparatus 400 may include a memory array 405 that includes sub-arrays 120(0-3) separated by gaps 410 (0-3). The apparatus 400 includes elements that have been previously described with respect to the apparatus 100 of FIG. 1 and/or the apparatus 200 of FIG. 2. Those elements have been shown in FIG. 4 using the same reference numbers used in FIGS. 1 and 2, and operation of the common elements is as previously described. Consequently, a detailed description of the operation of these elements will not be repeated in the interest of brevity.

The voltage of the global wordline GR0* (e.g., a second portion of the global wordline) may be driven via a global wordline transistor 460 and a voltage of the global wordline GR0* may be clamped via a global wordline clamp circuit 462. A gate of the global wordline transistor 460 may be provided a pulsed voltage signal VP, and when the voltage of the VP signal provided to the gate of the global wordline transistor 460 is greater than the V1 voltage by at least a threshold voltage of the global wordline transistor 460, a voltage provided to the global wordline GR0* by the global wordline transistor 460 may be the V1 voltage.

The apparatus 400 may include respective global wordline drivers 430(0-1) coupled between the global wordline GR0 (e.g., the first portion of the global wordline GR0) and the respective wordline WL0-1. The global wordline drivers 430 (0-1) may be configured to selectively couple the global wordline GR0 to the wordline WL0-1 responsive to the respective PHF0-1 signal. The gaps 410(0-3) may further include local wordline drivers 212(0-3) coupled between a global wordline GR0* and a respective wordline WL0-1. The local wordline drivers 212(0-3) may selectively couple the global wordline GL0* to the respective wordline WL0-1 responsive to a value of the respective PH0-1 signal. Additionally, the gaps 410(0-3) may include a respective pull-down transistor 432(0-1) coupled to a respective wordline WL0-1 that may be configured to selectively provide the V2 voltage to the respective wordline WL0-1.

In operation, during a first portion of a memory access operation associated with a first page coupled to the wordline WL0, the VP signal and the PH0 signal may be pulsed to a voltage greater than the V1 voltage and then settle at the V1 voltage. As will be explained further below, the pulsed voltage may be a VCCP-pulse voltage that is greater than the VCCP voltage. The PHF0 signal may be provided a voltage that equals the V2 voltage. Further, the global wordline GR0 may be equal to the V1 voltage. As explained with reference to FIGS. 1 and 2, the V1 voltage may be equal to the VCCP voltage and the V2 voltage may be equal to the VNWL voltage. As explained above, the global wordline transistor 460 may provide the V1 voltage to the global wordline GR0* responsive to the pulsed voltage of the VP signal. The pulsed voltage of the VP signal and the PH0 signal may provide the V1 voltage to the wordline WL0 via the global wordline transistor 460 and the local wordline drivers 212(0/2), and via the global wordline driver 430(0), which may charge the wordline WL0 at a faster rate as compared with providing the VP and PH0 signals having the V1 voltage. The global wordline clamp circuit 462 may clamp the voltage of the global wordline GR0* to limit the voltage of the global wordline GR0* from exceeding the pulsed voltage. Further, the PHF0 signal having the V2 voltage may activate the pull-down transistor 432(0) to couple the global wordline GR0 to the wordline WL0 and may deactivate the pull-down transistor 432(0) from providing the V2 voltage to the wordline WL0.

After the VP signal and PH0 signal each return to the V1 voltage, the global wordline transistor 460 may provide the V1 voltage of the global wordline GR0 minus a threshold voltage of the global wordline transistor 460 to the global wordline GR0*, and the local wordline drivers 212(0/2) may provide the voltage of global wordline GR0* to the wordline WL0.

Further, during a second portion of the memory access operation associated with the first page, the global wordline GR0 voltage may transition to the V2 voltage. Also during the second portion of the memory access operation, the PH0 signal may transition to the V2 voltage. The PH0 signal having the V2 voltage may deactivate the local wordline drivers 212(0/2) to decouple the global wordline GR0* from the wordline WL0. The voltage of the wordline WL0 may be discharged to the V2 voltage of the global wordline GR0 via the pull-down transistor 432(0). The PHF0 signal may transition to the V1 voltage, and the PHF0 signal having the V1 voltage may deactivate the pull-down transistor 432(0) to decouple the global wordline GR0 from the wordline WL0, and may activate the pull-down transistor 432(0) to provide the V2 voltage to the wordline WL0. The activated pull-down transistor 432(0) may hold the wordline WL0 at the V2 voltage.

It will be appreciated that a memory access operation associated with the wordline WL1 would operate similarly as the memory access operation associated with the wordline WL0, using the global wordline driver 430(1), pull-down transistor 432(1), and the local wordline drivers 212(1/3), rather than the global wordline driver 430(0), the pull-down transistor 432(0), and the local wordline drivers 212(0/2), respectively. In an embodiment, the pulsed voltage may be 4.2 volts, the V1 voltage may be 3.2 volts, and the V2 voltage may be −0.3 volts. The pulsed voltage of the VP and PH0-1 signals is present while the global wordline GR0 is equal to the V1 voltage, so using p-channel transistors in the global wordline drivers 130(0-1) to drive the wordlines WL0-1 may limit the maximum voltage differential across the transistors of the local wordline drivers 112(0-3) and across the global wordline transistor 240 to be a difference between V1 and V2. Thus, the degradation over time of the local wordline drivers 212(0-3) may be reduced, and reliability may be improved over architectures that require driving local wordline drivers using voltages greater than V1.

Figure 5:
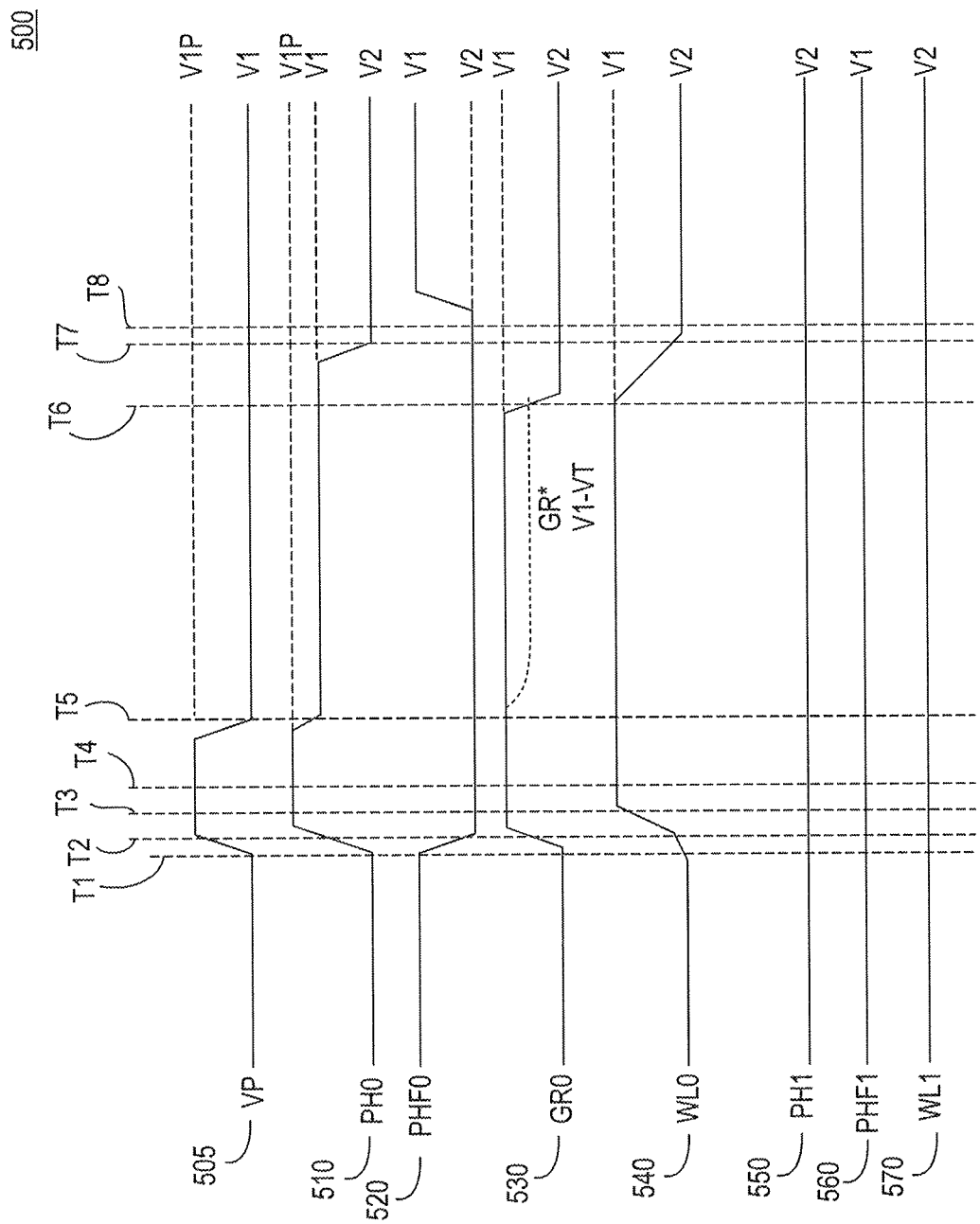
FIG. 5 is an exemplary timing diagram of driving a wordline voltage according to an embodiment of the disclosure.

Referring to FIG. 5, an exemplary timing diagram of driving a wordline voltage according to an embodiment of this disclosure is disclosed and generally designated 500. For example, the exemplary timing diagram 500 illustrates timing characteristics for various signals during operation of the apparatus 400 of FIG. 4 according to an embodiment of the invention. The timing diagram 500 depicts exemplary timing associated with operation of a global and local wordline drivers during a memory access operation associated with the wordline WL0. A VP signal 505, a PH0 signal 510, a PHF0 signal 520, a global wordline GR0 voltage 530, a wordline WL0 voltage 540, a PH1 signal 550, a PHF1 signal 560, and a wordline WL1 voltage 570 may correspond to the VP signal, the PH0 signal, the PHF0 signal, the PH1 signal, the PHF1 signal, the voltage of the global wordline GR0, the voltage of the wordline WL0, and the voltage of the wordline WL1, respectively, of FIG. 4. Since this is an exemplary memory access operation associated with the wordline WL0, the voltages of the PH1 signal 550, PHF1 signal 560, and wordline WL1 voltage 570 remain unchanged.

Prior to time T1, the PH0 signal 510, and the global wordline GR0 voltage 530 may be set to the V2 voltage and the VP signal 505 and the PHF0 signal 520 may be set to the V1 voltage. At time T1, a first portion of the memory access operation includes transitioning the VP signal 505 and the PH0 signal 510 to the pulsed voltage V1P and transitioning the PHF0 signal 520 to the V2 voltage, which may activate the global and local wordline drivers, such as the global wordline driver 430(0-1), pull-down transistor 432(0-1), and/or the local wordline drivers 212(0/2), respectively, of FIG. 4. At time T2, the global wordline GR0 voltage 530 begins transitioning to the V1 voltage, and the wordline WL0 voltage 540 begins ramping from the V2 voltage at a first rate based on the change in the global wordline GR0 voltage 530 via the global and local wordline drivers.

At time T3, the wordline WL0 voltage 540 begins ramping at a second rate faster than the first rate as the local wordline drivers and the global wordline driver become fully activated to charge the wordline to the V1 voltage. At time T4, the wordline WL0 voltage 540 is fully charged to the V1 voltage. After the wordline WL0 voltage 540 is charged to the V1 voltage, at time T5, the VP signal 505 and the PH0 signal 510 may be set at the V1 voltage. Setting the VP signal 505 to the V1 voltage may reduce the voltage of the global wordline GR0* to the V1 voltage less a threshold voltage as indicated between times T5 and T6.

At time T6, the second portion of the memory access operation includes the global wordline GR0 voltage 530 transitioning to the V2 voltage, which may cause the wordline WL0 voltage 540 to begin discharging toward the V2 voltage via the global and local wordline drivers. At time T7, the PH0 signal 510 may be equal to the V2 voltage, which may deactivate the local wordline drivers. Between times T6 and T8, the wordline WL0 voltage 540 completely discharges to the V2 voltage. At time T8, the wordline WL0 voltage 540 is equal to the V2 voltage. After time T8, the PHF0 signal 520 may transition to the V1 voltage to hold the wordline at the V2 voltage via the global wordline driver.

The exemplary timing diagram 500 is a non-limiting illustration to provide a sufficient understanding of embodiments of the disclosure. Those of ordinary skill in the art will appreciate that the relative timing of the signals of the exemplary timing diagram 400 may vary from system to system. For example, relative timing of transitions of the signals may vary. For example, the transition of the wordline WL0 voltage 540 may occur at different relative rates than depicted.

Figure 6:
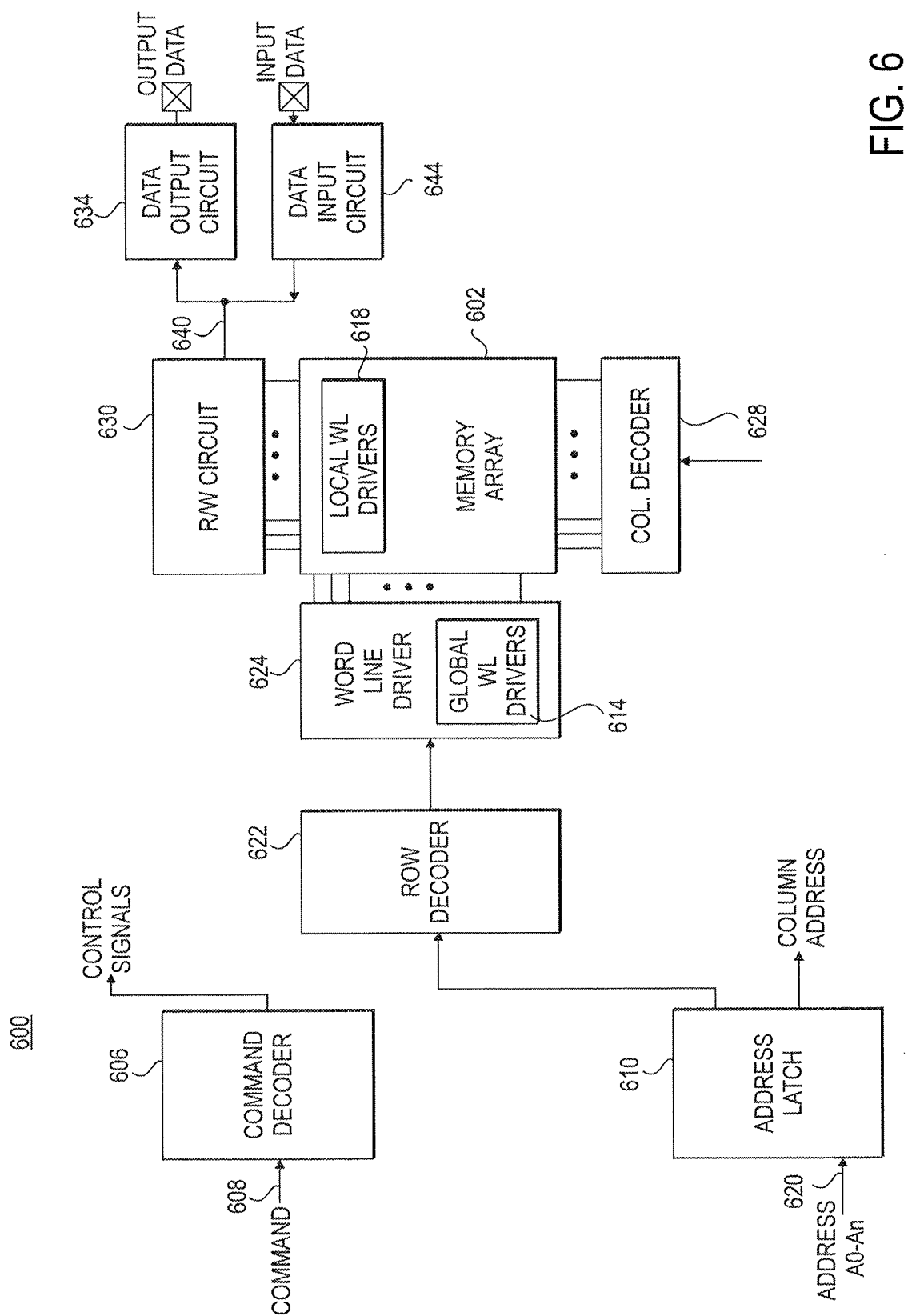
FIG. 6 is a block diagram of a memory including wordline drivers according to an embodiment of the disclosure.

FIG. 6 illustrates a portion of a memory 600 according to an embodiment of the present disclosure. The memory 600 includes a memory array 602 of memory cells, which may be, for example, volatile memory cells (e.g., DRAM memory cells, SRAM memory cells), non-volatile memory cells (e.g., flash memory cells, phase change memory cells), or some other types of memory cells. The memory 600 includes a command decoder 606 that receives memory commands through a command bus 608 and generates corresponding control signals within the memory 600 to carry out various memory operations. Row and column address signals are applied to the memory 600 through an address bus 620 and provided to an address latch 610. The address latch then outputs a separate column address and a separate row address.

The row and column addresses are provided by the address latch 610 to a row decoder 622 and a column address decoder 628, respectively. The column address decoder 628 selects bit lines extending through the memory array 602 corresponding to respective column addresses. The row decoder 622 is connected to wordline driver 624 that activates respective rows of memory cells in the memory array 602 corresponding to received row addresses. In some embodiments, the wordline driver 624 may include global wordline drivers 614 to facilitate driving wordline voltages during memory access operations to the memory array 602. The global wordline drivers 614 may include the global wordline driver 130(0-1) of FIG. 1, the global wordline driver 130(0-1) and/or the global wordline transistor 240 of FIG. 2, and/or the global wordline driver 430(0-1), the global wordline transistor 460, and/or the global wordline clamp circuit 462 of FIG. 4. Further, in some embodiments, the memory array 602 may include local wordline drivers 618 to facilitate driving wordline voltages during memory access operations to the memory array 602. The local wordline drivers 618 may include the local wordline drivers 112(0-1) of FIG. 1, the local wordline drivers 212(0-1) of FIG. 2, and/or the local wordline drivers 212(0-1) and/or the pull-down transistor 432(0-1) of FIG. 4. The selected digit line (e.g., a bit line or bit lines) corresponding to a received column address are coupled to a read/write circuit 630 to provide read data to a data output circuit 634 via an input-output data bus 640. An output pad coupled to the data output circuit 634 is used for electrically coupling to the memory 600. Write data are applied to the memory array 602 through a data input circuit 644 and the memory array read/write circuitry 630. An input pad coupled to the data input circuit 644 is used for electrically coupling to the memory 600. The command decoder 606 responds to memory commands applied to the command bus 608 to perform various operations on the memory array 602. In particular, the command decoder 606 is used to generate internal control signals to read data from and write data to the memory array 602.

Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as previously described.

What is claimed is:

1. An apparatus comprising:
a memory array comprising a plurality of sub-arrays, the plurality of sub arrays coupled to a wordline, the memory array further comprising a plurality of local wordline drivers coupled between a global wordline and the wordline, the plurality of local wordline drivers configured to selectively couple the wordline to the global wordline during a memory access operation, wherein a local wordline driver of the plurality of local wordline drivers comprises a first transistor and a second transistor coupled in series between the wordline and the global wordline, wherein, responsive to the first transistor being activated and responsive to the global wordline driver having a first voltage, the local wordline driver is configured to provide a voltage that is equal to the first voltage less a threshold voltage of the second transistor to the wordline; and
a global wordline driver configured to selectively couple the wordline to the global wordline during the memory access operation.

2. The apparatus of claim 1, wherein the global wordline driver comprises a transistor coupled between the global wordline and the wordline, the transistor configured to selectively couple the global wordline to the wordline.

3. The apparatus of claim 2, wherein the global wordline driver further comprises a second transistor coupled between the wordline and a second voltage supply node, the second transistor configured to selectively provide a second voltage of the second voltage supply node to the wordline.

4. The apparatus of claim 3, wherein the first transistor is a p-channel transistor and the second transistor is an n-channel transistor.

5. An apparatus comprising:
a memory array comprising a plurality of sub-arrays, the plurality of sub arrays coupled to a wordline, the memory array further comprising
a plurality of local wordline drivers coupled between a global wordline and the wordline, wherein the global wordline comprises a transistor coupled in series along the global wordline, wherein the transistor of the global wordline is configured to selectively couple a first portion of the global wordline to a second portion of a global wordline, the plurality of local wordline drivers configured to selectively couple the wordline to the second portion of the global wordline during a memory access operation, wherein a local wordline driver of the plurality of local wordline drivers comprises a transistor, wherein, responsive to the transistor of the local wordline driver being activated and responsive to the first portion of the global wordline driver having a first voltage, the local wordline driver is configured to provide a voltage that is equal to the first voltage less a threshold voltage of the transistor of the global wordline to the wordline; and
a global wordline driver configured to selectively couple the wordline to the first portion of the global wordline during the memory access operation.

6. The apparatus of claim 5, wherein the transistor of the global wordline is configured to be activated responsive to a control signal having the first voltage, and wherein, responsive to the global wordline having a first voltage, the transistor of the global wordline is configured to provide the first voltage less a threshold voltage of the transistor of the global wordline to the transistor of the local wordline driver responsive to the transistor of the global wordline being activated.

7. The apparatus of claim 6, wherein the transistor of the global wordline is configured to be activated responsive to the control signal having a pulsed voltage that is greater than the first voltage during a portion of the memory access operation, wherein, responsive to the global wordline having a first voltage, the transistor of the global wordline is configured to provide the first voltage to the transistor of the local wordline driver while the control signal has the pulsed voltage.

8. The apparatus of claim 7, wherein a gate of the transistor of the local wordline driver is configured to receive the pulsed voltage while the control signal has the pulse voltage, wherein, responsive to the global wordline having the first voltage, the transistor of the local wordline driver is configured to provide the first voltage to the wordline while the gate of the transistor is receiving the pulsed voltage.

9. The apparatus of claim 7, wherein the memory array further comprises a pull-down transistor that is configured to selectively couple the wordline to a second voltage that is less than the first voltage.

10. The apparatus of claim 5, wherein the global wordline driver comprises a first transistor coupled between the global wordline and the wordline, the first transistor configured to selectively couple the global wordline to the wordline, wherein the global wordline driver further comprises a second transistor coupled between the wordline and a second voltage supply node, the second transistor configured to selectively provide a second voltage of the second voltage supply node to the wordline.

11. An apparatus comprising:
a global wordline;
a memory array comprising a wordline and a local wordline driver, the local wordline driver configured to selectively couple the global wordline to the wordline during a memory access operation, the local wordline driver comprising a first transistor coupled in series with a second transistor between the wordline and the global wordline; and
a global wordline driver coupled between the global wordline and the wordline, the global wordline driver configured to selectively couple the global wordline to the wordline.

12. The apparatus of claim 11, wherein the first transistor and the second transistor are each n-channel transistors.

13. The apparatus of claim 11, wherein the global wordline driver comprises a transistor coupled between the global wordline and the wordline, the transistor configured to selectively couple the global wordline to the wordline.

14. The apparatus of claim 13, wherein the global wordline driver further comprises a second transistor configured to selectively provide a second voltage to the wordline.

15. The apparatus of claim 14, wherein the transistor is a p-channel transistor and the second transistor is an n-channel transistor.

16. An apparatus comprising:
a global wordline;
a memory array comprising a wordline and a local wordline driver, the local wordline driver configured to selectively couple the global wordline to the wordline during a memory access operation, wherein the global wordline comprises a first transistor coupled serially along the global wordline, wherein the transistor of the global wordline is configured to selectively couple a first portion of the global wordline to a second portion of the global wordline, and wherein the local wordline driver comprises a second transistor coupled between the wordline and the second portion of the global wordline; and a global wordline driver coupled between the first portion of the global wordline and the wordline, the global wordline driver configured to selectively couple the first portion of the global wordline to the wordline.

17. The apparatus of claim 16, wherein the first transistor and the second transistor are each n-channel transistors.

18. The apparatus of claim 16, wherein the global wordline driver comprises a transistor coupled between the global wordline and the wordline, the transistor configured to selectively couple the global wordline to the wordline.

19. The apparatus of claim 18, wherein the global wordline driver further comprises a second transistor configured to selectively provide a second voltage to the wordline.

20. The apparatus of claim 16, wherein the memory array further comprises a pull-down transistor that is configured to selectively provide a second voltage that is less than the first voltage to the wordline.

* * * * *